United States Patent
Wei et al.

(10) Patent No.: US 11,996,495 B2
(45) Date of Patent: May 28, 2024

(54) METHOD FOR TRANSFERRING MICRO LIGHT-EMITTING DIODES AND TRANSFERRING DEVICE

(71) Applicant: Chengdu Vistar Optoelectronics Co., Ltd., Sichuan (CN)

(72) Inventors: Dong Wei, Chengdu (CN); Xiaolong Yang, Chengdu (CN); Rubo Xing, Chengdu (CN); Huashan Chen, Chengdu (CN)

(73) Assignee: Chengdu Vistar Optoelectronics Co., Ltd., Chengdu (CN)

( * ) Notice: Subject to any disclaimer, the term of this patent is extended or adjusted under 35 U.S.C. 154(b) by 730 days.

(21) Appl. No.: 17/144,522

(22) Filed: Jan. 8, 2021

(65) Prior Publication Data

US 2021/0135042 A1 May 6, 2021

Related U.S. Application Data

(63) Continuation of application No. PCT/CN2019/086479, filed on May 10, 2019.

(30) Foreign Application Priority Data

Nov. 20, 2018 (CN) .......................... 201811386856.1

(51) Int. Cl.
  *H01L 33/00* (2010.01)
  *H01L 25/075* (2006.01)
(52) U.S. Cl.
  CPC ........ *H01L 33/005* (2013.01); *H01L 25/0753* (2013.01)

(58) Field of Classification Search
  CPC .......................... H01L 33/005; H01L 25/0753
  See application file for complete search history.

(56) References Cited

U.S. PATENT DOCUMENTS

2002/0171089 A1* 11/2002 Okuyama ............. H01L 27/156
  257/88
2014/0340900 A1 11/2014 Bathurst et al.
(Continued)

FOREIGN PATENT DOCUMENTS

CN  101794848 A  8/2010
CN  102903804 A  1/2013
(Continued)

OTHER PUBLICATIONS

International Search Report issued on Aug. 20, 2019 in corresponding International Application No. PCT/CN2019/086479; 8 pages.
(Continued)

*Primary Examiner* — Samuel A Gebremariam
(74) *Attorney, Agent, or Firm* — Maier & Maier, PLLC

(57) ABSTRACT

The present application provides a method for transferring micro light emitting diodes and a transferring device. The device includes: a first substrate, having at least one surface arranged with a plurality of first adhesive region for a plurality of micro light emitting diodes to adhere thereon; and a transferring substrate, having at least one surface arranged with a plurality of second adhesive regions for at least a portion of the micro light emitting diodes to adhere on and being configured to transfer the at least a portion of the micro light emitting diodes to a driving back plate.

13 Claims, 9 Drawing Sheets

(56) References Cited

U.S. PATENT DOCUMENTS

| | | |
|---|---|---|
| 2017/0215280 A1 | 7/2017 | Chaji et al. |
| 2018/0096977 A1 | 4/2018 | Ahmed et al. |
| 2018/0294387 A1 | 10/2018 | Li et al. |

FOREIGN PATENT DOCUMENTS

| | | |
|---|---|---|
| CN | 105493297 A | 4/2016 |
| CN | 106170849 A | 11/2016 |
| CN | 106601657 A | 4/2017 |
| CN | 106876293 A | 6/2017 |
| CN | 106903978 A | 6/2017 |
| CN | 107154374 A | 9/2017 |
| CN | 107799455 A | 3/2018 |
| CN | 207116403 U | 3/2018 |
| CN | 107889540 A | 4/2018 |
| CN | 108140664 A | 6/2018 |
| CN | 108231653 A | 6/2018 |
| CN | 108323215 A | 7/2018 |
| CN | 108346606 A | 7/2018 |
| CN | 108431971 A | 8/2018 |
| CN | 108447965 A | 8/2018 |
| CN | 108475661 A | 8/2018 |

OTHER PUBLICATIONS

Chinese First Office Action issued on Nov. 3, 2020 in corresponding Chinese Application No. 201811386856.1; 16 pages.
Chinese First Office Action issued on Nov. 3, 2020 in corresponding Chinese Application No. 201811386849.1; 15 pages.

\* cited by examiner

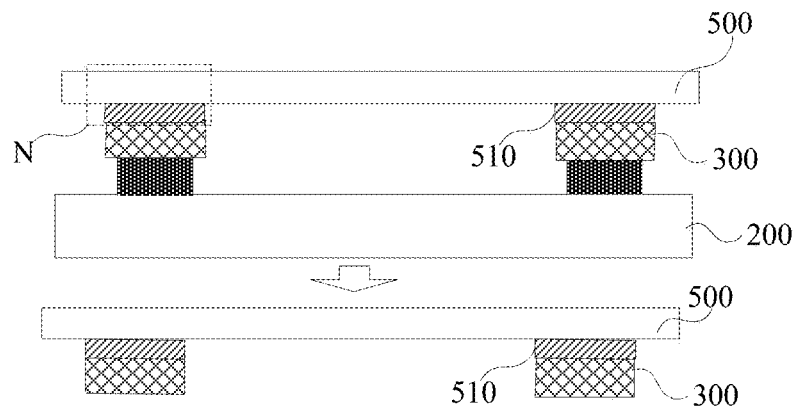

FIG. 4D

```
┌─────────────────────────────────────────────────┐ S131
│ a fourth adhesive layer may be evenly coated on the at │
│      least one surface of the transferring substrate    │
└─────────────────────────────────────────────────┘
                          ↓
┌─────────────────────────────────────────────────┐ S132
│ the fourth adhesive layer may be pressed by a pressing │
│   plate having an uneven surface to form the plurality of │
│                    adhesive bumps                       │
└─────────────────────────────────────────────────┘
```

FIG. 5

```
┌─────────────────────────────────────────────────┐ S171
│  the at least a portion of the plurality of micro LEDs │
│   adhered with the transferring substrate may be bonded │
│      with driving electrodes on the driving back plate  │
└─────────────────────────────────────────────────┘
                          ↓
┌─────────────────────────────────────────────────┐ S172
│ the plurality of second adhesive regions on the transferring │
│ substrate may be treated, such that the at least a portion of │
│   the plurality of micro LEDs may be separated from the │
│                 transferring substrate                  │
└─────────────────────────────────────────────────┘
```

FIG. 6

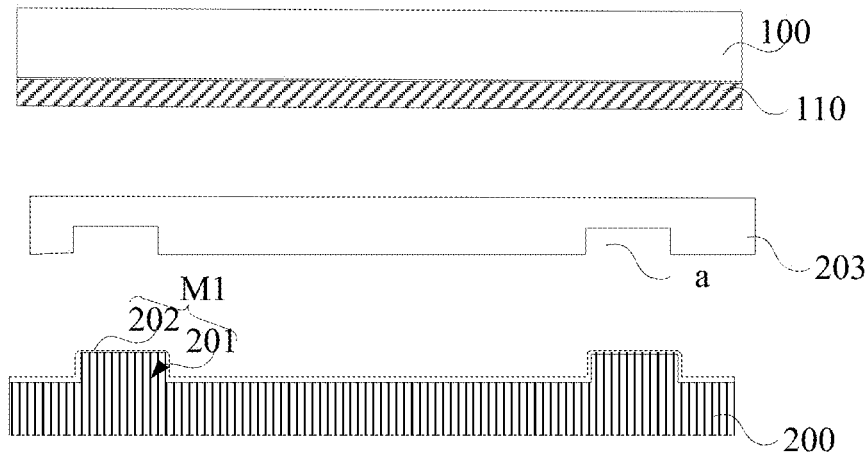

FIG. 7

```
                                                                    S200
the transferring substrate may be provided, at least one surface of the
transferring substrate may be arranged with a plurality of protrusions, and a
  plurality of second adhesive layers may be arranged on the plurality of
                              protrusions
```

```
                                                                    S210
 the plurality of protrusions arranged with the second adhesive layers and
  arranged on the transferring substrate may be aligned with and close to the
  surface of the first substrate adhered with the plurality of micro LEDs
```

```
                                                                    S220
the second adhesive layers on the plurality of protrusions on the transferring
   substrate may contact the micro LEDs on the first substrate, such that the
 second adhesive layers on the transferring substrate may adhere with at least
              a portion of the plurality of micro LEDs
```

```
                                                                    S230
 the transferring substrate and the first substrate may be separated, such that
 the at least a portion of the plurality of micro LEDs may be transferred to the
                         transferring substrate
```

```
                                                                    S240
the micro LEDs on the transferring substrate may be transferred to the driving
                              back plate
```

FIG. 8

METHOD FOR TRANSFERRING MICRO LIGHT-EMITTING DIODES AND TRANSFERRING DEVICE

CROSS REFERENCE TO RELATED APPLICATIONS

The present application is a continuation-application of International (PCT) Patent Application No. PCT/CN2019/086479 filed on May 10, 2019, which claims foreign priority of Chinese Patent Application No. 201811386856.1, filed on Nov. 20, 2018 in the National Intellectual Property Administration of China, the entire contents of which are hereby incorporated by reference in its entirety.

TECHNICAL FIELD

The present disclosure relates to the field of transferring micro light-emitting diodes, and in particular to a method for transferring micro light-emitting diodes and a transferring device.

BACKGROUND

A technology of micro light-emitting diode (micro LED) may refer to integrating a large number of tiny sized micro LED arrays on a substrate into an array. The micro LED may exhibit extremely high emission efficiency and have extremely long service life. The technology of micro LED is expected to be a leader of display technologies of a next generation.

Currently, costs of manufacturing micro LED may significantly impact commercialization of the micro LED. A technology of transferring a large amount of micro LED has hit a plateau and needs a breakthrough. Conventionally, transferring a large amount of micro LED may require an array of carriers to align with the micro LED arrays accurately. In such a way, costs and an environment of manufacturing micro LED may be strictly controlled, such that an efficiency of transferring the large amount of micro LED and a yield of micro LED may be limited.

SUMMARY OF THE DISCLOSURE

According to an aspect of the present disclosure, a device for transferring micro light diodes devices may be provided and include: a first substrate; a plurality of first adhesive regions; a transferring substrate; and a plurality of second adhesive regions. The plurality of first adhesive regions are disposed on at least one surface of the first substrate and are defined to adhere a plurality of micro light emitting diodes. The transferring substrate is configured to transfer at least a portion of the plurality of micro light emitting diodes to a driving back plate. The plurality of second adhesive regions are disposed on at least one surface of the transferring substrate and are defined to adhere at least a portion of the plurality of micro light emitting diodes.

According to another aspect of the present disclosure, a method for transferring micro light emitting devices is provided and includes: providing a first substrate, defining a first adhesive region; adhering a plurality of micro light emitting diodes onto the first adhesive region; providing a transferring substrate, defining a plurality of second adhesive regions; aligning the plurality of second adhesive regions with the surface of the first substrate adhering with the plurality of micro light emitting diodes; the plurality of second adhesive regions with the plurality of micro light emitting diodes to adhere the plurality of second adhesive regions with at least part of the plurality of micro light emitting diodes; separating the transferring substrate from the first substrate; and transferring the micro light emitting diodes adhered on the transferring substrate to a driving back plate.

According to still another aspect of the present disclosure, a device for transferring micro light emitting diodes is provided and includes: a first substrate and a transferring substrate. The first substrate defines a first adhesive region, and a plurality of micro light emitting diodes are capable of being adhered to the first adhesive region. The transferring substrate is arranged with a plurality of adhesive bumps protruding from a surface of the transferring substrate. A surface of each adhesive bump away from the transferring substrate has the property of viscosity and is capable of being adhered to at least part of the plurality of micro light emitting diodes. Adhesiveness of the surface of each adhesive bump is greater than adhesiveness of the first adhesive region.

According to the present disclosure, a method for transferring micro light emitting diodes and a transferring device may be provided. At least one surface of the transferring substrate may be arranged with a plurality of second adhesive regions, and the micro light emitting diodes carried on the first substrate may be transferred to a driving back plate by the plurality of second adhesive regions at once, such that transferring a large amount of micro light emitting diodes may be achieved, improving an efficiency of transferring the micro light emitting diodes.

BRIEF DESCRIPTION OF THE DRAWINGS

FIG. 4D is a schematic view of transferring the micro LEDs from the transferring substrate to a driving back plate according to a first embodiment of the present disclosure.

FIG. 5 is a flow chart of a method for manufacturing an adhesive bump according to an embodiment of the present disclosure.

FIG. 6 is a flow chart of an operation of S170 shown in FIG. 3 according to an embodiment of the present disclosure.

FIG. 7 is a schematic view of a transferring device according to a second embodiment of the present disclosure.

FIG. 8 is a flow chart of a method for transferring a large amount of micro LEDs according to the second embodiment of the present disclosure.

DETAILED DESCRIPTION

Figure 1:
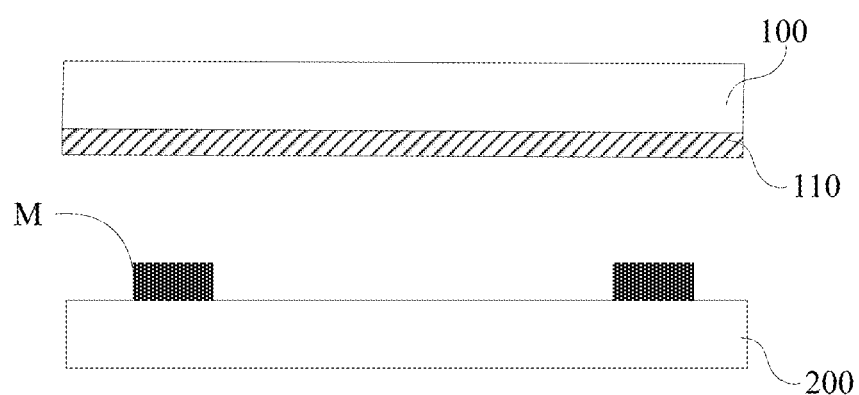
FIG. 1 is a schematic view of a transferring device according to a first embodiment of the present disclosure.

Technical solutions of the present disclosure will be illustrated clearly and comprehensively by referring to the drawings of embodiments. Obviously, illustrated embodiments are only a part of, but not all of, the embodiments. On the basis of the embodiments of the present disclosure, any one of skill in the related art may obtain other embodiments without making creative work, and the other embodiments should be within the scope of the present disclosure.

As shown in FIG. 1, a schematic view of a transferring device according to a first embodiment is provided. In FIG. 1, the transferring device of the present disclosure may include a first substrate 100 and a transferring substrate 200.

At least one surface of the first substrate 100 may define a plurality of first adhesive regions, and a plurality of micro LEDs may be adhered onto the adhesive region.

Specifically, at least one surface of the first substrate 100 may be arranged with a first adhesive layer 110. A surface of the first adhesive layer 110 away from the first substrate 100 may be adhesive and may define the plurality of first adhesive regions. The micro LEDs may be adhered with the first substrate 100 via the first adhesive layer 110. A material of the first adhesive layer 110 may be at least one of adhesive resin, epoxy resin, phenol-formaldehyde resin, urea formaldehyde resin, polyurethane, polyvinyl acetal, and chlorinated polyvinyl chloride resin, which will not be limited by the present disclosure. The first adhesive layer 110 may be adhesive by itself. During transferring, the plurality of micro LEDs may be arranged on the first substrate 100 into an array. The plurality of micro LEDs being arranged on the first substrate 100 into the array may refer to the plurality of micro LEDs being arranged into a predefined number of rows and a predefined number of columns. Distances between any two adjacent rows may be identical or different, and/or distances between any two adjacent columns may be identical or different, and the distances will not be limited by the present disclosure.

At least one surface of the transferring substrate 200 may define a plurality of second adhesive regions. At least a portion of the plurality of micro LEDs may be adhered onto the second adhesive regions, and the at least a portion of the plurality of micro LEDs may be transferred to a driving back plate via the transferring substrate.

An adhesiveness of the first adhesive regions may be less than that of the second adhesive regions. In such a way, when the second adhesive regions on the transferring substrate 200 contact the plurality of micro LEDs adhered with the first substrate 100, at least a portion of the plurality of micro LEDs arranged in the array on the first substrate 100 may be selected and transferred to the transferring substrate 200 due to an adhesiveness difference between the first adhesive regions and the second adhesive regions.

In one embodiment, a plurality of bumps M may be arranged on the surface of the transferring substrate 200, and a surface of each bump M away from the transferring substrate 200 may be adhesive. In such a way, the plurality of bumps M may be a plurality of adhesive bumps M, and a plurality of adhesive surfaces of the plurality of adhesive bumps M may define the plurality of second adhesive regions. The plurality of adhesive bumps M may adhere the at least a portion of the plurality of micro LEDs via the plurality of adhesive surfaces and transfer the at least a portion of the plurality of micro LEDs to the driving back plate.

Alternatively, the adhesiveness of the first adhesive layer 110 on the first substrate 100 may be less than an adhesiveness of each adhesive bump M. The adhesive bump M may be made of an adhesive material. A material of the adhesive bump M and the first adhesive layer 110 may be at least one of adhesive resin, epoxy resin, phenol-formaldehyde resin, urea formaldehyde resin, polyurethane, polyvinyl acetal, and chlorinated polyvinyl chloride resin, which will not be limited by the present disclosure.

Alternatively, in the present embodiment, the plurality of micro LEDs arranged in the array on the first substrate 100 may be selectively transferred to the transferring substrate 200 due to an adhesiveness difference between the adhesive bump on the transferring substrate 200 and the first adhesive layer 110 on the first substrate 100. Regions between adhesive bumps M may be unable to contact the micro LEDs on the first substrate 100. In such a way, accuracy and a yield of the transferring substrate 200 selecting the plurality of micro LEDs may further be improved.

Alternatively, in the present embodiment, the plurality of adhesive bumps M may be arranged in an array and evenly arranged on the transferring substrate 200, and the array of micro LEDs may be evenly arranged on the first substrate 100. The array of adhesive bumps M being evenly arranged on the transferring substrate 200 may refer to distances between any two adjacent adhesive bumps M may be identical. The array of micro LEDs evenly arranged on the first substrate 100 may refer to distances between any two adjacent micro LEDs may be identical. Alternatively, the array of the adhesive bumps M may not be evenly arranged on the transferring substrate 200, and the array of micro LEDs may not be evenly arranged on the first substrate 100. Under such a situation, distances between adjacent micro LEDs along a corresponding row direction and a corresponding column direction may be different, which will not be limited by the present disclosure. Similarly, an array of the plurality of second adhesive regions being arranged on the transferring substrate 200 may be similar to the array of micro LEDs being arranged on the first substrate 100. That is, the micro LEDs may be evenly or unevenly arranged along a row direction and along a column direction, and distances between adjacent micro LEDs along a corresponding row direction and a corresponding column direction may be identical or different.

Alternatively, in the present embodiment, a distance between two adjacent second adhesive regions on the transferring substrate 200 may be set to be multiple integer times of a distance between two adjacent micro LEDs arranged on the first substrate 100. Specifically, a distance between two adjacent second adhesive regions along the row direction on the transferring substrate 200 may be multiple integer times of a distance between two adjacent micro LEDs arranged along the row direction on the first substrate 100. A distance between two adjacent second adhesive regions along the column direction on the transferring substrate 200 may be multiple integer times of a distance between two adjacent micro LEDs arranged long the column direction on the first substrate 100. Specifically, the multiple integer times may be one time, three times, five times, and the like, which will not be limited by the present disclosure.

Figure 2:
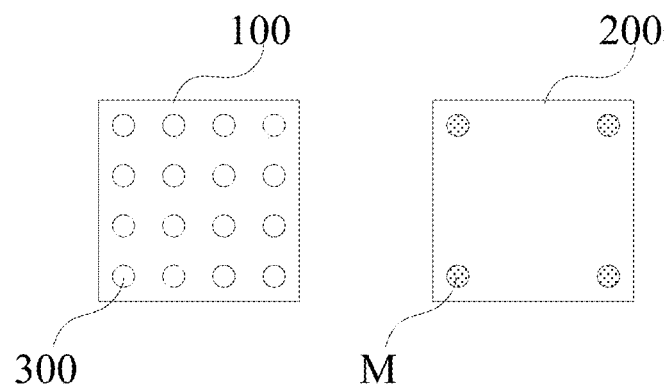
FIG. 2 is a schematic view of an arrangement of light-emitting diodes (LEDs) on a first substrate and an arrangement of adhesive bumps on a transferring substrate according to an embodiment of the present disclosure.

An arrangement of the plurality of second adhesive regions (adhesive bumps) on the transferring substrate and an arrangement of the plurality of micro LEDs on the first substrate may be illustrated in details by referring to FIG. 2. As shown in FIG. 2, when a size of the first substrate 100 is equal to a size of the transferring substrate 200, the plurality of micro LEDs may be arranged on the first substrate 100 into an array of 4×4. That is, 4 rows of micro LEDs 300 and 4 columns of micro LEDs 300 may be arranged on the first substrate 100. The plurality of adhesive bumps M may be arranged on the transferring substrate 200 into an array of 2×2. That is, 2 rows of adhesive bumps M and 2 columns of adhesive bumps M may be arranged on the transferring substrate 200. Therefore, the number of the micro LEDs on the first substrate 100 may be 4 times of the number of the adhesive bumps M on the transferring substrate 200.

Alternatively, a region of the first substrate 100 adhered by each micro LED 300 may be taken as a unit grid, each unit grid of the first substrate 100 may be arranged with each micro LED 300. Along the row direction and the column direction, a distance between two adjacent micro LEDs along the row direction and along the column direction may be one unit grid. Similarly, another adhesive bump M may be arranged with two adhesive bumps away from a first adhesive bump M. That is, a distance between two adjacent adhesive bumps along the row direction may be three unit grids. In the present embodiment, a distance between two adjacent adhesive bumps M along the row and/or column direction on the transferring substrate 200 may be three time of a distance between two adjacent micro LEDs along the row and/or column direction on the first substrate 100. Of course, FIG. 2 only shows an exemplary number and arrangement of the micro LEDs 300 on the first substrate 100 and an exemplary number and arrangement of the adhesive bumps M on the transferring substrate 200, but the number and the arrangement should not be limited by the present disclosure. In other embodiments, distances between two adjacent adhesive bumps along the row and/or column directions may be in various multiple integer times of distances between two adjacent micro LEDs along the row and/or column directions, such that the plurality of micro LEDs may be selectively transferred. For example, in one a distance between any two adjacent adhesive bumps of a first row on the transferring substrate 200 may be 5 times of a distance between any two adjacent micro LEDs of a first row on the first substrate 100. A distance between any two adjacent adhesive bumps of a second row on the transferring substrate 200 may be 3 times of a distance between any two adjacent micro LEDs of a second row on the first substrate 100. A distance between any two adjacent adhesive bumps of a first column on the transferring substrate 200 may be equal to a distance between any two adjacent micro LEDs of a first column on the first substrate 100. It may be understood that, in the present embodiment, the driving back plate may define a plurality of pixel receiving regions in an array. Each pixel receiving region may be defined to receive one of the at least a portion of the plurality of micro LEDs 300. An arrangement of the plurality of pixel receiving regions may be the same as the arrangement of the plurality of micro LEDs 300 on the transferring substrate 200. In the present embodiment, the pixel receiving regions may be arranged into an array of 2×2 on the driving back plate. That is, 2 rows of pixel receiving regions and 2 columns of pixel receiving regions may be arranged on the driving back plate to receive the micro LEDs 300 on the transferring substrate 200.

According to the above arrangement of the adhesive bumps M on the transferring substrate 200 and the above arrangement of the micro LEDs 300 on the first substrate 100, the plurality of micro LEDs on the first substrate 100 may be selectively transferred to the transferring substrate 200.

Alternatively, the transferring device of the present disclosure may further include a transmission assembly (not shown in the figure). The transmission assembly may be a mechanic arm or a vacuum nozzle, which will not be limited by the present disclosure. The transmission assembly may be arranged on a surface of the transferring substrate 200 away from the surface arranged with the plurality of second adhesive regions and arranged to drive the transferring substrate 200 to transfer the micro LEDs to the driving back plate. In other embodiments, the transmission assembly may not be integrally arranged with the transferring substrate. That is, only when the transferring substrate 200 is required to transfer the micro LEDs, the transmission assembly may be connected to the transferring substrate 200 and drive the transferring substrate to transfer the micro LEDs. Detailed transferring operations may be described in the embodiments showing the method for transferring the micro LEDs.

In addition, the transferring device in the present disclosure may further include a peeling apparatus (not shown in the figure). The peeling apparatus may be configured to peel the micro LEDs being selectively adhered on the transferring substrate 200. After the micro LEDs on the transferring substrate 200 bond with driving electrodes in the pixel receiving regions of the driving back plate, the peeling apparatus may perform an operation to the second adhesive regions (adhesive bumps M) of the transferring substrate 200, the operation may include at least one of heating, ultra-violet radiation, and soaking with a chemical solution, such that the adhesiveness of the second adhesive regions may be reduced or eliminated.

In other embodiments, the peeling apparatus may not be a necessity. That is, after the micro LEDs on the transferring substrate 200 bond with the driving electrodes in the pixel receiving regions of the driving back plate, the abovementioned operations may not be performed to the adhesive bumps M, and the micro LEDs may be separated from the transferring substrate 200 physically, such that the micro LEDs may be transferred to the driving back plate to achieve electrical connections between the micro LEDs and a driving array of the driving back plate. In such a way, a display having micro LEDs may be formed.

According to the above embodiments, the adhesive bumps may be configured as carriers of the micro LEDs, such that the large amount of micro LEDs may be selectively transferred, and regions between adjacent adhesive bumps may not contact the micro LEDs on the first substrate, such that the accuracy and the yield of transferring the micro LEDs may be improved.

Figure 3:
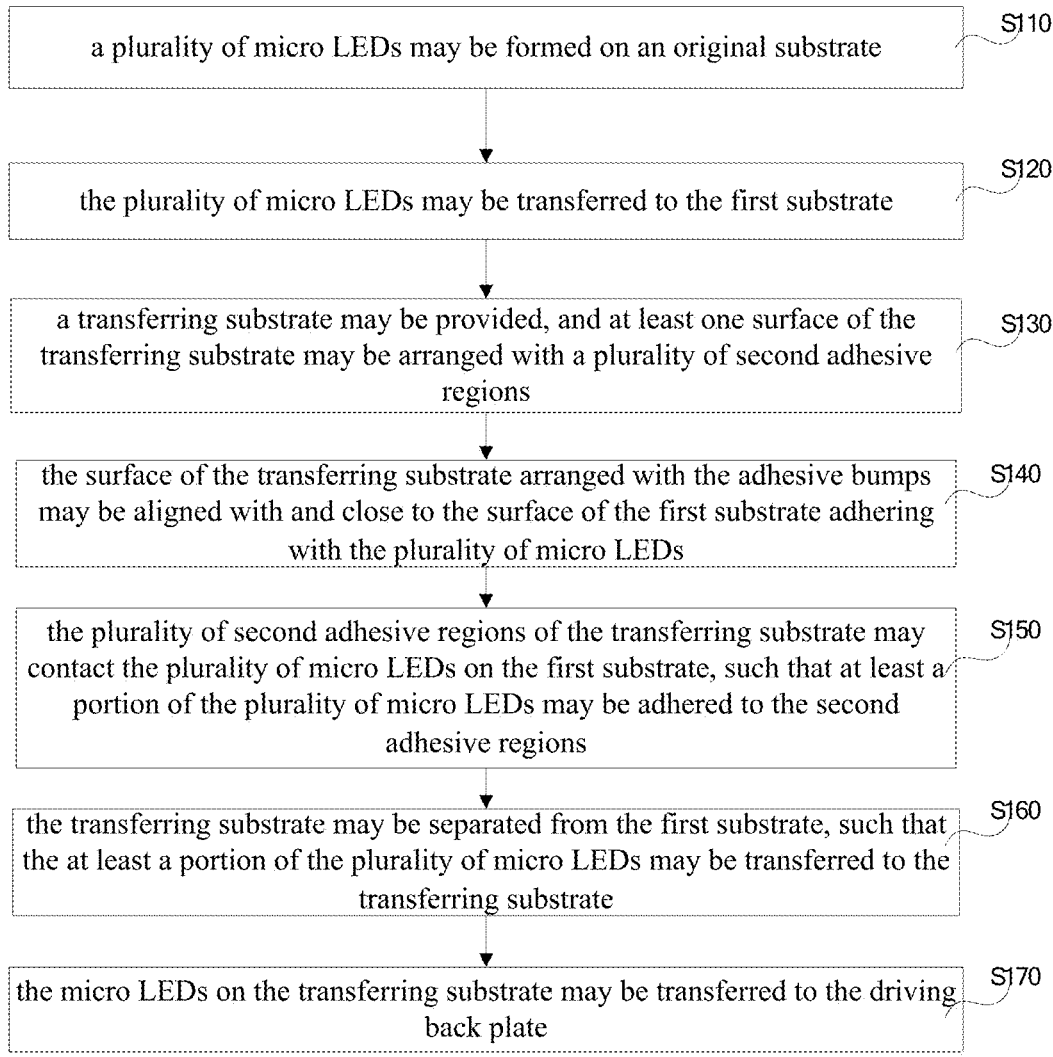
FIG. 3 is a flow chart of a method for transferring a large amount of micro LEDs according to the first embodiment of the present disclosure.

As shown in FIG. 3, a flow chart of a method for transferring a large amount of micro LEDs according to the first embodiment of the present disclosure is provided. The method in the present embodiment may be performed based on the transferring device as described in the first embodiment. The method may include following operations.

The micro LED mentioned in the present disclosure may include a red micro light emitting diode, a green micro light emitting diode, and a blue micro light emitting diode. Before performing the method for transferring the large amount of micro LEDs, following operations may be performed.

In an operation of S110, a plurality of micro LEDs may be formed on an original substrate.

The original substrate may be a substrate transparent to a laser, such as a blue sapphire substrate, a silicon carbide (SiC) substrate, and the like, which will not be limited by the present disclosure. The plurality of micro LEDs may be configured to be arranged on a display panel. It may be understood that, in the present embodiment, one or more micro LEDs may be formed on the original substrate, and the plurality of micro LEDs on the original substrate may be arranged into an array.

In an operation of S120, the plurality of micro LEDs may be transferred to the first substrate.

Figure 4A:
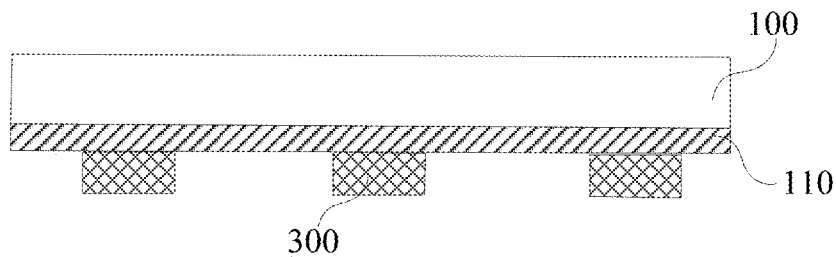
FIG. 4A is a schematic view of a first substrate during transferring micro LEDs according to the first embodiment of the present disclosure.

Referring to FIGS. 4A-4D, in the present embodiment, the plurality of micro LEDs may be peeled off from the original substrates by a laser and may be transferred to the first substrate 100. As shown in FIG. 4A, a surface of the first substrate 100 may be arranged with a first adhesive layer 110, and the plurality of micro LEDs 300 may be adhered with the first substrate 100 via the first adhesive layer 110. A light emitting surface of each micro LED may be facing to a surface of the transferring substrate 200 arranged with the plurality of second adhesive regions. A material of the first adhesive layer 110 may be at least one of adhesive resin, epoxy resin, phenol-formaldehyde resin, urea formaldehyde resin, polyurethane, polyvinyl acetal, and chlorinated polyvinyl chloride resin, which will not be limited by the present disclosure.

Alternatively, in the present embodiment, the plurality of micro LEDs 300 may be arranged on the first substrate 100 into an array. Arranging the micro LEDs on the first substrate 100 into the array may be processing the micro LEDs on the substrate into the array after the micro LEDs 300 being peeled off from the original substrate. Alternatively, the micro LEDs may be arranged into the array on the original substrate directly, and the array of the micro LEDs may be peed off without being disrupted and adhered to the first substrate 100 via the first adhesive layer 110. Means of arranging the micro LEDs on the first substrate 100 into the array will not be limited by the present disclosure.

The operations of S110 and S120 may not be necessities of the present disclosure, and any one of skill in the art may modify or omit the operations according to actual demands.

In an operation of S130, a transferring substrate may be provided, and at least one surface of the transferring substrate may be arranged with a plurality of second adhesive regions.

Figure 4B:
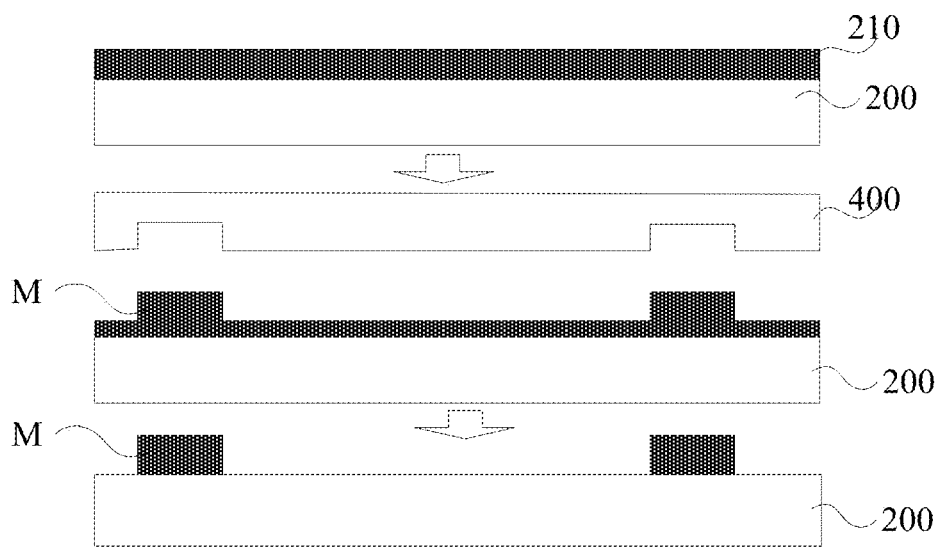
FIG. 4B is a schematic view of a transferring substrate during transferring micro LEDs according to the first embodiment of the present disclosure.

Referring to FIG. 4B, a plurality of adhesive bumps M may be arranged on the at least one surface of the transferring substrate 200. A top surface of each adhesive bump M may be a second adhesive region. Referring to FIG. 5, a flow chart of a method for manufacturing an adhesive bump according to an embodiment of the present disclosure is provided, and manufacturing the adhesive bumps may include following operations.

In an operation of S131, a fourth adhesive layer may be evenly coated on the at least one surface of the transferring substrate.

Referring to FIG. 4B, the fourth adhesive layer 210 may be evenly coated on the at least one surface (that is, a surface facing to the first substrate 100) of the transferring substrate 200. A material of the fourth adhesive layer 210 may be at least one of adhesive resin, epoxy resin, phenol-formaldehyde resin, urea formaldehyde resin, polyurethane, polyvinyl acetal, and chlorinated polyvinyl chloride resin, which will not be limited by the present disclosure. In one embodiment, the fourth adhesive layer 210 may be coated by one or more means of blade coating, spraying, spin-coating, and printing, which will not be limited by the present disclosure.

Alternatively, in the present embodiment, an adhesiveness of the first adhesive layer 100 on the first substrate 100 may be less than that of the fourth adhesive layer 210 on the transferring substrate 200. The array of the plurality of micro LEDs 300 on the first substrate 100 may be transferred to the transferring substrate 200 due to an adhesiveness difference between the transferring substrate 200 and the first substrate 100.

In an operation of S132, the fourth adhesive layer may be pressed by a pressing plate having an uneven surface to form the plurality of adhesive bumps.

Referring to FIG. 4B, the fourth adhesive layer 210 on the transferring substrate 200 may be pressed by a second pressing plate 400 having an uneven surface to form the plurality of adhesive bumps M. In the present embodiment, the second pressing plate 400 may be a nano-imprint plate. The plurality of adhesive bumps M may be arranged on the transferring substrate 200 into an array, and an arrangement of the plurality of adhesive bumps M on the transferring substrate 200 may be different from an arrange of the plurality of micro LEDs 300 on the first substrate 100, which may refer to the arrangements shown in FIG. 2 and will not be repeatedly described hereinafter.

Further, an inductively coupled plasma etching or a reactive ion etching may be performed to remove any adhesive remaining between two adjacent adhesive bumps M, such that the regions between two adjacent adhesive bumps M may not impact subsequent transferring.

According to the above embodiment, the adhesive bumps serving as carriers to transfer the micro LEDs may be manufactured via the nano-imprinting operation. The nano-imprinting operation may be simply performed, have relatively low costs, and may be suitable for industrialized manufacturing, such that a large amount of micro LEDs may be transferred, improving the efficiency of transferring. Alternatively, distances between adjacent adhesive bumps on the transferring substrate may be multiple integer times of distances between adjacent micro LEDs on the first substrate, such that a portion of the plurality of micro LEDs may be selected and transferred.

In an operation of S140, the surface of the transferring substrate arranged with the adhesive bumps may be aligned with and close to the surface of the first substrate adhering with the plurality of micro LEDs.

In the present embodiment, by means of the transmission assembly (such as the mechanic arm or the vacuum nozzle) arranged on a surface of the transferring substrate 200 away from the surface arranged with the plurality of second adhesive regions, the transferring substrate 200 may be driven to align with and move close to the surface of the first substrate adhering with the plurality of micro LEDs. In the operation of S140, light emitting surfaces of the micro LEDs 300 may be aligned with and close to the second adhesive regions of the adhesive bumps M on the transferring substrate 200.

In an operation of S150, the plurality of second adhesive regions of the transferring substrate may contact the plurality of micro LEDs on the first substrate, such that at least a portion of the plurality of micro LEDs may be adhered to the second adhesive regions.

Figure 4C:
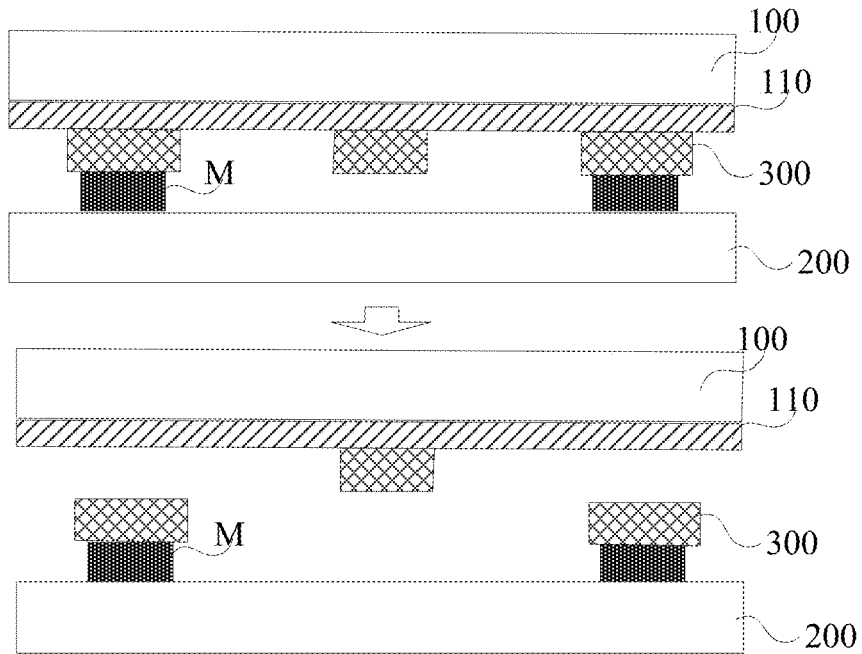
FIG. 4C is a schematic view of transferring micro LEDs from the first substrate to the transferring substrate according to the first embodiment of the present disclosure.

Referring to FIG. 4C, the transmission assembly may drive the transferring substrate 200 to enable the adhesive bumps M on the transferring substrate 200 to correspondingly bond with the plurality of micro LEDs on the first substrate 100, such that the adhesive bumps M on the transferring substrate 200 may adhere the at least a portion of the plurality of micro LEDs. Alternatively, regions between two adjacent adhesive bumps M may not contact the micro LEDs 300 on the first substrate 100. Therefore, the accuracy and the yield of collecting the micro LEDs may be improved.

In an operation of S160, the transferring substrate may be separated from the first substrate, such that the at least a portion of the plurality of micro LEDs may be transferred to the transferring substrate.

Further, the transmission assembly may drive the transferring substrate 200 to move away from the first substrate 100. In such a way, the micro LEDs bonding with the adhesive bumps M may be separated from the first substrate and transferred to the transferring substrate 200 due to the adhesiveness difference between the adhesive bumps M and the first adhesive layer 110 on the first substrate 100. The light emitting surfaces of the micro LEDs 300 may be adhered with the second adhesive regions of the adhesive bumps M on the transferring substrate 200.

In an operation of S170, the micro LEDs on the transferring substrate may be transferred to the driving back plate.

Referring to FIG. 6, the operation of S170 may further include following operations.

In an operation of S171, the at least a portion of the plurality of micro LEDs adhered with the transferring substrate may be bonded with driving electrodes on the driving back plate.

Figure 9A:
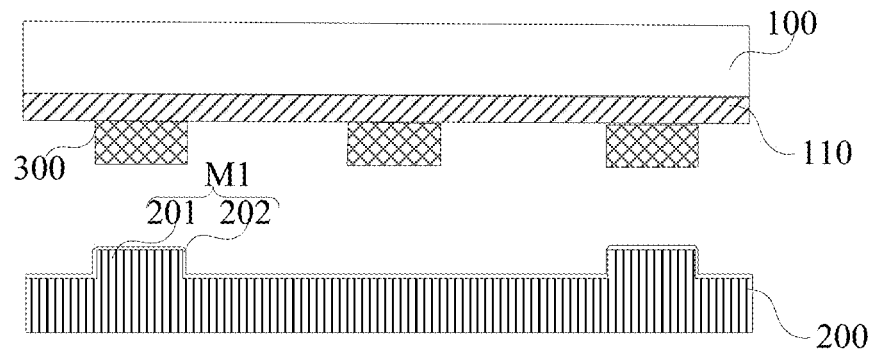
FIG. 9A is a schematic view of transferring micro LEDs according to the second embodiment of the present disclosure.
Figure 9B:
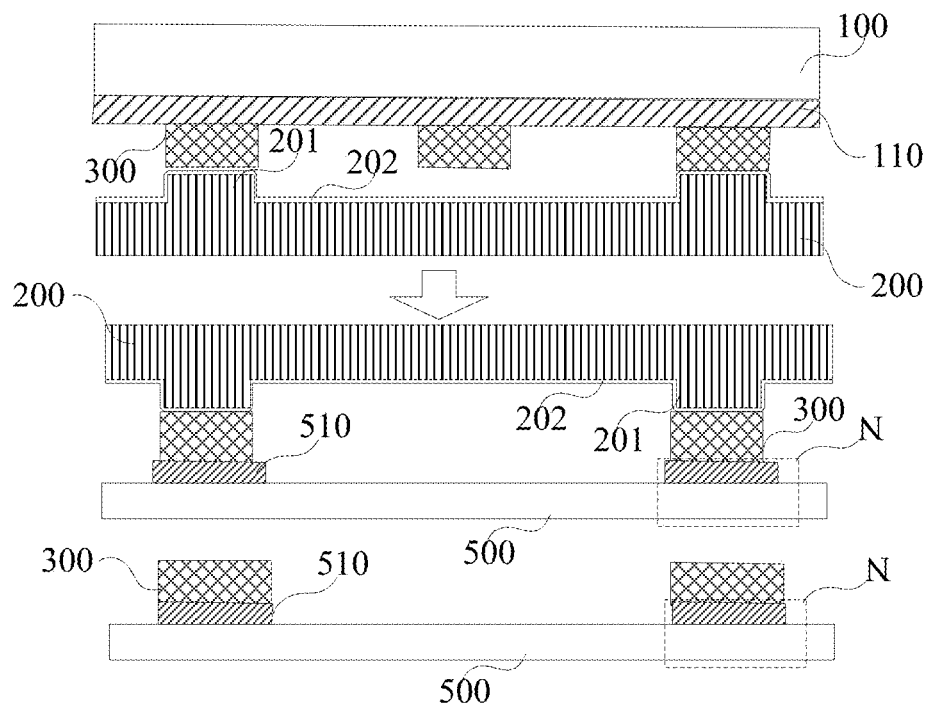
FIG. 9B is another schematic view of transferring micro LEDs according to the second embodiment of the present disclosure.
Figure 10:
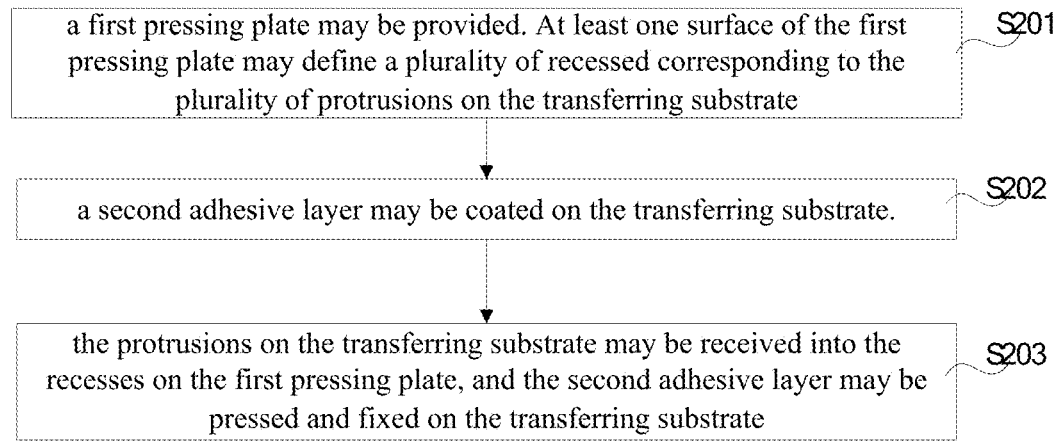
FIG. 10 is a flow chart of an operation of S200 shown in FIG. 8 according to an embodiment of the present disclosure.

Further referring to FIG. 4D and FIG. 9B, a pixel defining layer (not shown in the figure) may be arranged on the driving back plate 500. The pixel defining layer may define a plurality of subpixel receiving regions N. Each subpixel receiving region N may be defined to receive one of the at least a portion of the plurality of micro LEDs. Referring to FIG. 4D, each subpixel receiving region N may at least include a driving electrode 510 electrically connected to the micro LED 300.

Alternatively, in the present embodiment, the plurality of subpixel receiving regions N may be defined to correspond to the plurality of adhesive bumps M on the transferring substrate 200, and the number of subpixel receiving regions N on the driving back plate 500 may be equal to the number of adhesive bumps M on the transferring plate 200. Therefore, the micro LEDs on the transferring substrate 200 may be correspondingly bonded with driving electrodes 510 on the driving back plate 500 directly by the transmission assembly.

When the micro LEDs are transferred from the original substrate to the first substrate 100, electrodes of the micro LEDs 300 may be electrically connected to electrodes on the first substrate 100 (the light emitting surface of the micro LED may be away from the surface of the first substrate arranged with the first adhesive layer 110). After the adhesive bumps M on the transferring substrate 200 collect the micro LEDs 300 on the first substrate, the electrodes of the micro LEDs may not be electrically connected to electrodes on the transferring substrate (the light emitting surface of the micro LEDs may be adhered with the second adhesive regions of the adhesive bumps M on the transferring substrate 200), and the micro LEDs 300 may be transferred to the driving back plate 500 and directly electrically connected to the electrodes 510 on the driving back plate 500 (the light emitting surfaces of the micro LEDs 300 may be opposite to the surface of the driving back plate arranged with the driving electrodes 510). That is, during the transferring operations, electronic polarities of the micro LEDs may not be reversed.

In an operation of S172, the plurality of second adhesive regions on the transferring substrate may be treated, such that the at least a portion of the plurality of micro LEDs may be separated from the transferring substrate.

Alternatively, in an operation of S172, after the micro LEDs 300 on the transferring substrate 200 correspondingly bonding with the driving electrodes 510 on the driving back plate 500, the micro LEDs 300 may need to be separated from the transferring substrate 200. Before separating the micro LEDs 300 from the transferring substrate 200, operations may be performed to the adhesive bumps M on the transferring substrate 200 by a peeling apparatus (not shown in the figure). The operations may include at least one of heating, ultra-violet radiation, and soaking with a chemical solution, such that the adhesiveness of the adhesive bumps on the transferring substrate 200 may be reduced and eliminated.

In other embodiments, the peeling apparatus may be omitted. That is, the above-mentioned operations may not be performed to the adhesive bumps M, and the micro LEDs may be separated from the transferring substrate 200 physically, such that the micro LEDs 300 may be transferred to the driving back plate 500. The micro LEDs may be welded, such that the micro LEDs 300 and the array of the driving electrodes 510 on the driving back plate 500 may be electrically connected to form the display having micro LEDs.

Alternatively, in one embodiment, the light emitting surface of the micro LED may be directly adhered to the adhesive layer of the first substrate. That is, during transferring, the micro LEDs may need to be reversed twice (that is, two transferring substrates may be required to reverse the light emitting surface of the micro LED), such that the light emitting surface of the micro LED may be away to the surface of the driving back plate arranged with the driving electrodes.

According to the above embodiments, the array of the plurality of adhesive bumps may be arranged on at least one surface of the transferring substrate and may serve as carriers for transferring the micro LEDs, such that the large amount of micro LEDs may be selectively transferred. The method for manufacturing the adhesive bumps, serving as the carriers for transferring the micro LEDs, may be simple, have low costs, and may be suitable for industrialized manufacturing. By performing the method in the present disclosure to transfer the micro LEDs, the efficiency and the yield of transferring the micro LEDs may be improved.

As shown in FIG. 7, a schematic view of a transferring device according to a second embodiment of the present disclosure is provided. The present embodiment may be similar to a structure of the transferring device disclosed in the first embodiment. However, the adhesive bump on the transferring substrate in the present embodiment may include a protrusion of the transferring substrate itself and a second adhesive layer arranged on the protrusion. Alternatively, the protrusion of the transferring substrate and the transferring substrate may be formed as an integral structure.

The transferring device in the present disclosure may include the first substrate 100 and the transferring substrate 200.

At least one surface of the first substrate 100 may be configured for a plurality of micro LEDs to be arranged. Alternatively, the surface of the first substrate 100 for carrying the micro LEDs may be arranged with a first adhesive layer 110. The first adhesive layer 110 may be arranged to adhere the micro LEDs. The plurality of micro LEDs may be arranged on the first substrate 100 periodically. After the micro LEDs being peeled off from the original substrate, the micro LEDs may be arranged and processed into an array on the first substrate 100. Alternatively, the array of micro LEDs may be formed on the original substrate directly, peeled off from the original substrate, and then adhered to the first substrate 100 via the first adhesive layer 110. Means of arranging the micro LEDs into the array on the first substrate may not be limited by the present disclosure.

Alternatively, at least one surface of the transferring substrate 200 may be arranged with a plurality of protrusions 201 and a plurality of second adhesive layer 202 arranged on the plurality of protrusions 201. The plurality of protrusions 201 and the plurality of second adhesive layers 202 on the protrusions 201 may form a plurality of adhesive bumps M1, and the plurality of adhesive bumps M1 may adhere with the micro LEDs on the first substrate 100 and transfer the micro LEDs to the driving back plate. An array of the adhesive bumps M1 may be arranged on the transferring substrate 200. The micro LEDs may be arranged on the first substrate 100. A distance between two adjacent adhesive bumps M1 on the transferring substrate 200 may be multiple integer times of a distance between two adjacent micro LEDs on the first substrate 100. Detailed arrangements of the adhesive bumps M1 and the micro LEDs may refer to the first embodiment of the present disclosure, which will not be repeatedly described hereinafter.

Alternatively, the transferring device in the present embodiment may include a first pressing plate 203. At least one surface of the first pressing plate 203 may define a plurality of recesses a corresponding to the plurality of protrusions 201 on the transferring substrate 200. The protrusions 201 may be received into the recesses a, such that the second adhesive layers 202 may be pressed onto the transferring substrate 200, and the adhesive bumps M1 may be formed on the transferring substrate The adhesive bumps M1 may be configured to collect the micro LEDs on the first substrate 100.

An adhesiveness of the first adhesive layer 110 on the first substrate 100 may be less than that of the second adhesive layer 202 on the transferring substrate 200. A material of the first adhesive layer 110 and the second adhesive layer 202 may be at least one of adhesive resin, epoxy resin, phenol-formaldehyde resin, urea formaldehyde resin, polyurethane, polyvinyl acetal, and chlorinated polyvinyl chloride resin, which will not be limited by the present disclosure.

According to the present embodiment, the array of the plurality of micro LEDs on the first substrate may be selectively transferred to the transferring substrate 200 due to an adhesiveness difference between the transferring substrate 200 and the adhesive on the first substrate 100. Regions between adjacent adhesive bumps M1 may not contact the micro LEDs on the first substrate 100, the accuracy and the yield of collecting the micro LEDs by the transferring substrate 200 may further be improved.

Being similar to the transferring device shown in the first embodiment, in the present embodiment, the transferring device may further include the transmission assembly to drive the transferring substrate 200 to move, such that the transferring substrate 200 may collect the micro LEDs adhered on the first substrate 100 and further transfer the micro LEDs to the driving back plate. The arrangement of the transmission assembly may refer to the above description, which will not be repeatedly described hereinafter.

The transferring device may further include a peeling apparatus (not shown in the figure). The peeling apparatus may be configured to peel at least a portion of the plurality of micro LEDs off from the transferring substrate 200. An arrangement of the peeling apparatus may refer to the transferring device described in the first embodiment, which will not be repeatedly described hereinafter. In other embodiments, the peeling apparatus may not be a necessity. That is, after the micro LEDs on the transferring substrate 200 is correspondingly bonded with the driving electrodes in the subpixel regions on the driving back plate, the above operations may not be performed to the second adhesive layer 202 on the protrusion 201, and the micro LEDs may be physically peeled off from the transferring substrate 200 directly, such that the micro LEDs may be transferred to the driving back plate, and an electric connection between the micro LEDs and the driving electrodes on the driving back plate may be achieved, such that the display having the micro LEDs may be formed.

According to the above embodiment, the adhesive layer may be arranged on the transferring substrate having protrusions to form adhesive bumps. The adhesive bumps may serve as carriers for transferring the micro LEDs, such that the large amount of the micro LEDs may be selectively transferred. Regions between adjacent adhesive bumps may not contact the micro LEDs on the first substrate, such that the accuracy and the yield of transferring the micro LEDs may be improved.

As shown in FIG. 8, a flow chart of a method for transferring a large amount of micro LEDs according to the second embodiment of the present disclosure is provided. The method for transferring the micro LEDs in the present embodiment may be performed via the transferring device shown in the second embodiment. Any operations being the same or similar to those in the first embodiment will not be repeatedly described hereinafter. The method of the present embodiment may include following operations.

In an operation of S200, the transferring substrate may be provided, at least one surface of the transferring substrate may be arranged with a plurality of protrusions, and a plurality of second adhesive layers may be arranged on the plurality of protrusions.

Referring to FIGS. 9A-9B, schematic views of a micro LED according to the second embodiment of the present disclosure are provided. As shown in FIG. 9A, it may be understood that, before transferring the micro LEDs 300, the micro LEDs 300 may be formed on the original substrate, peeled off from the original substrate, and transferred to the first substrate 100. At least one surface of the first substrate 100 may be arranged with the first adhesive layer 110, and the micro LEDs 300 may be adhered to the first substrate 100 via the first adhesive layer 110.

Alternatively, the transferring substrate 200 may be provided, and at least one surface of the transferring substrate 200 may be arranged with a plurality of protrusions 201. Alternatively, the protrusions and the transferring substrate may be formed as an integral structure. The plurality of second adhesive layer 202 may be arranged on the plurality of protrusions 201, such that a plurality of adhesive bumps M1, being adhesive and uneven, may be formed. Referring to FIG. 19, the operation of S200 may further include following operations.

In an operation of S201, a first pressing plate may be provided. At least one surface of the first pressing plate may define a plurality of recessed corresponding to the plurality of protrusions on the transferring substrate.

Figure 11:
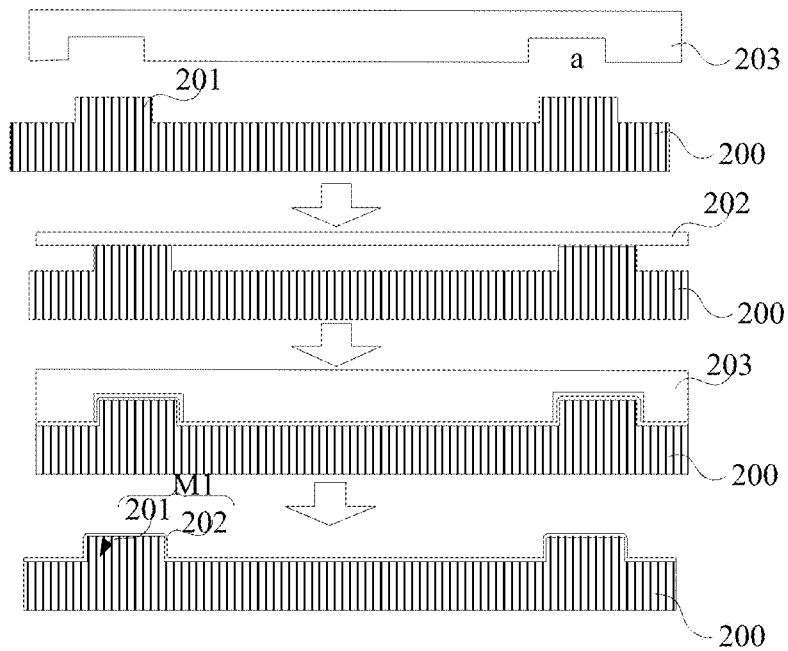
FIG. 11 is a schematic view of manufacturing a second adhesive layer of a bump on a transferring substrate according to an embodiment of the present disclosure.

As shown in FIG. 11, a schematic view of manufacturing a second adhesive layer of a bump on a transferring substrate according to an embodiment of the present disclosure is provided. In the present embodiment, at least one surface of the first pressing plate 203 may define a plurality of recesses a corresponding to the plurality of protrusions 201 on the transferring substrate 200. The transferring substrate 200 and the first pressing plate 203 may be arranged with pressed patterning array, and the first pressing plate 203 may be made of a release material.

In an operation of S202, a second adhesive layer may be coated on the transferring substrate.

The second adhesive layer 202 may be coated onto surfaces of the plurality of protrusions 201 of the transferring substrate 200, the second adhesive layer 202 may be coated by one or more means of blade coating, spraying, spin-coating, and adhering with a double-sided tape, which will not be limited by the present disclosure.

In an operation of S203, the protrusions on the transferring substrate may be received into the recesses on the first pressing plate, and the second adhesive layer may be pressed and fixed on the transferring substrate.

Alternatively, a pressing operation may be performed to press the transferring substrate 200 and the first pressing plate 203 correspondingly to the second adhesive layer 202, such that the plurality of protrusions 201 may become the plurality of adhesive bumps M1 having adhesiveness. The arrangement of the plurality of protrusions 201 on the transferring substrate 200 may be different from the arrangement of the micro LEDs on the first substrate. The number of the micro LEDs 100 on the first substrate may be an integer multiple times of the number of the adhesive bumps M1 on the transferring substrate 200. Detailed description may refer to the above-mentioned embodiments, which will not be repeatedly described hereinafter. Alternatively, the second adhesive layer 202 may be coated on the transferring substrate 200, such that selectively transferring the large amount of micro LEDs may be achieved.

In an operation of S210, the plurality of protrusions arranged with the second adhesive layers and arranged on the transferring substrate may be aligned with and close to the surface of the first substrate adhered with the plurality of micro LEDs.

In the present embodiment, the transferring substrate 200 may be driven by the transmission assembly (such as a mechanic arm or a vacuum nozzle) arranged on the transferring substrate 200 to align with and move close to the surface of the first substrate adhered with the plurality of micro LEDs 300. The light emitting surfaces of the micro LEDs 300 may be aligned with and close to the protrusions M1 of the transferring substrate 200.

In an operation of S220, the second adhesive layers on the plurality of protrusions on the transferring substrate may contact the micro LEDs on the first substrate, such that the second adhesive layers on the transferring substrate may adhere with at least a portion of the plurality of micro LEDs.

Referring to FIG. 9B, the plurality of protrusions 201 arranged with the second adhesive layer 202 and arranged on the transferring substrate 200 may be correspondingly pressed with the micro LEDs on the first substrate 100, such that the adhesive bumps M1 of the transferring substrate 200 may adhere with the at least a portion of the plurality of micro LEDs 300. In the present embodiment, regions between adjacent protrusions 201 may be arranged with the second adhesive layer 202, but may not contact the micro LEDs 300 on the first substrate 100. Therefore, the accuracy and the yield of collecting the micro LEDs 300 may be improved.

In an operation of S230, the transferring substrate and the first substrate may be separated, such that the at least a portion of the plurality of micro LEDs may be transferred to the transferring substrate.

Further, the transmission assembly may drive the transferring substrate 200 to move away from the first substrate 100, and the micro LEDs 300 adhered with the second adhesive layer 202 on the protrusions 201 may be separated from the first substrate and transferred to the transferring substrate 200 due to the adhesive difference between the second adhesive layer 202 on the protrusions 201 and the first adhesive layer 110 on the first substrate 100. The light emitting surfaces of the micro LEDs 300 may be adhered with the second adhesive layer 202 of the transferring substrate 200.

In an operation of S240, the micro LEDs on the transferring substrate may be transferred to the driving back plate.

Figure 12:
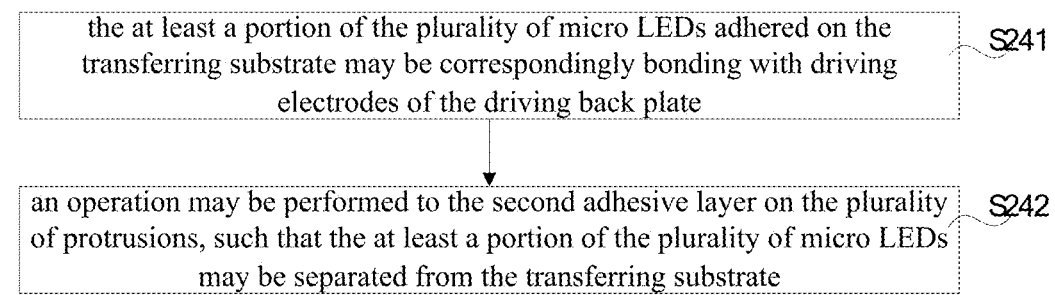
FIG. 12 is a flow chart of an operation S240 shown in FIG. 8 according to an embodiment of the present disclosure.

As shown in FIG. 12, the operation of S240 may further include following operations.

In an operation of S241, the at least a portion of the plurality of micro LEDs adhered on the transferring substrate may be correspondingly bonding with driving electrodes of the driving back plate.

Referring to FIG. 9B, the driving back plate 500 may be arranged with a pixel defining layer (not shown in the figure). The pixel defining layer may include a plurality of subpixel receiving regions N. Each subpixel receiving region N may be configured to receive one of the at least a portion of the plurality of micro LEDs. Each subpixel receiving region N may at least include a driving electrode 510 electrically connected to the micro LED 300. Alternatively, an arrangement of the plurality of subpixel receiving regions N may be the same as the arrangement of plurality of protrusions 201 on the transferring substrate 200, and the number of the subpixel receiving regions N on the driving back plate 500 may be the same as the number of adhesive bumps M1 on the transferring substrate 200. Therefore, the micro LEDs 300 adhered with the adhesive layer 201 may be correspondingly bonding with the driving electrodes on the driving back plate 500.

In an operation of S242, an operation may be performed to the second adhesive layer on the plurality of protrusions, such that the at least a portion of the plurality of micro LEDs may be separated from the transferring substrate.

Alternatively, the operation may be performed to the adhesive bumps M1 on the transferring substrate 200 by the peeling apparatus. The operation my include at least one of heating, ultra-violet radiation, or soaking with a chemical solution, such that the adhesiveness of the second adhesive layer may be reduced or eliminated. In other embodiments, the above operations may not be performed to the second adhesive layer, and the micro LEDs 300 may be separated from the transferring substrate 200 physically by the transmission assembly. In such a way, the micro LED 300 may be transferred to the driving back plate 500 to achieve an electrical connection between the micro LED and the driving electrode 510 of the driving back plate 500, and the display having micro LEDs may be formed.

Being similar to the method for transferring the micro LEDs as described in the first embodiment, arrangement between the light emitting surface of the micro LEDs and the first substrate may be considered, and one or two transferring substrate may be required respectively to achieve transferring of the micro LEDs, enabling the light emitting surface of the LEDs to be opposite to the surface of the driving back plate arranged with the driving electrodes.

According to the above embodiments, the transferring substrate may be arranged with the plurality of protrusions, the adhesive layer may be arranged on the transferring substrate, and the protrusions arranged with the adhesive layer and being adhesive may serve as carriers for transferring the plurality of micro LEDs, such that the large amount of micro LEDs may be selectively transferred. Operations of using the adhesive bumps as carriers for transferring the micro LEDs may be simple, have low costs, and may be industrialized applied. By performing the method in the present disclosure to transfer the large amount of the micro LEDs, the efficiency and the yield of transferring the micro LEDs may be improved.

Figure 13:
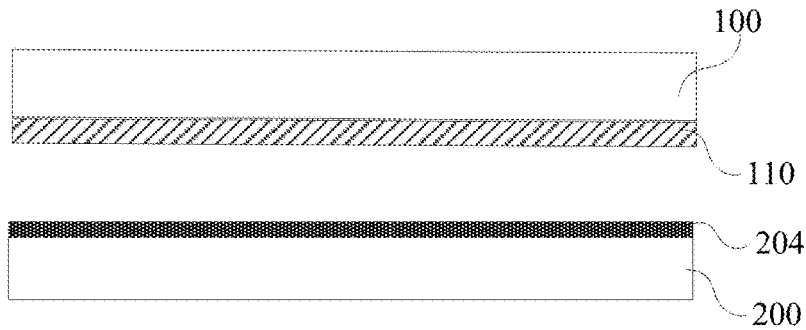
FIG. 13 is a schematic view of a transferring device according to a third embodiment of the present disclosure.

As shown in FIG. 13, a schematic view of a transferring device according to a third embodiment of the present disclosure is provided. The transferring device in the present embodiment may be similar the transferring device in the first and the second embodiments. However, in the present embodiment, the adhesive bumps may not be arranged. All identical components will not be repeatedly described hereinafter. In the present embodiment, the transferring device may include the first substrate 100 and the transferring substrate 200.

At least one surface of the first substrate 100 may be arranged with the first adhesive layer 110. The first adhesive layer 110 may be configured to support a plurality of micro LEDs. A structure of the first substrate 100 may refer to the transferring device shown in the first and the second embodiments, which will not be repeatedly described hereinafter.

Further, the transmission assembly (not shown in the figure) and the peeling apparatus (not shown in the figure) may be arranged. The transmission assembly may be configured to drive the transferring substrate 200 to move, and the peeling apparatus may be configured to separate at least a portion of the plurality of micro LEDs from the transferring substrate 200, such that the display having the micro LEDs may be formed. Detailed operations may refer to the above description, which will not be repeatedly described hereinafter.

Alternatively, at least one surface of the transferring substrate 200 may be arranged with a third adhesive layer 204. The third adhesive layer 204 may be configured to adhere to at least a portion of the plurality of micro LEDs and transfer the at least a portion of the plurality of micro LEDs to the driving back plate.

Figure 14:
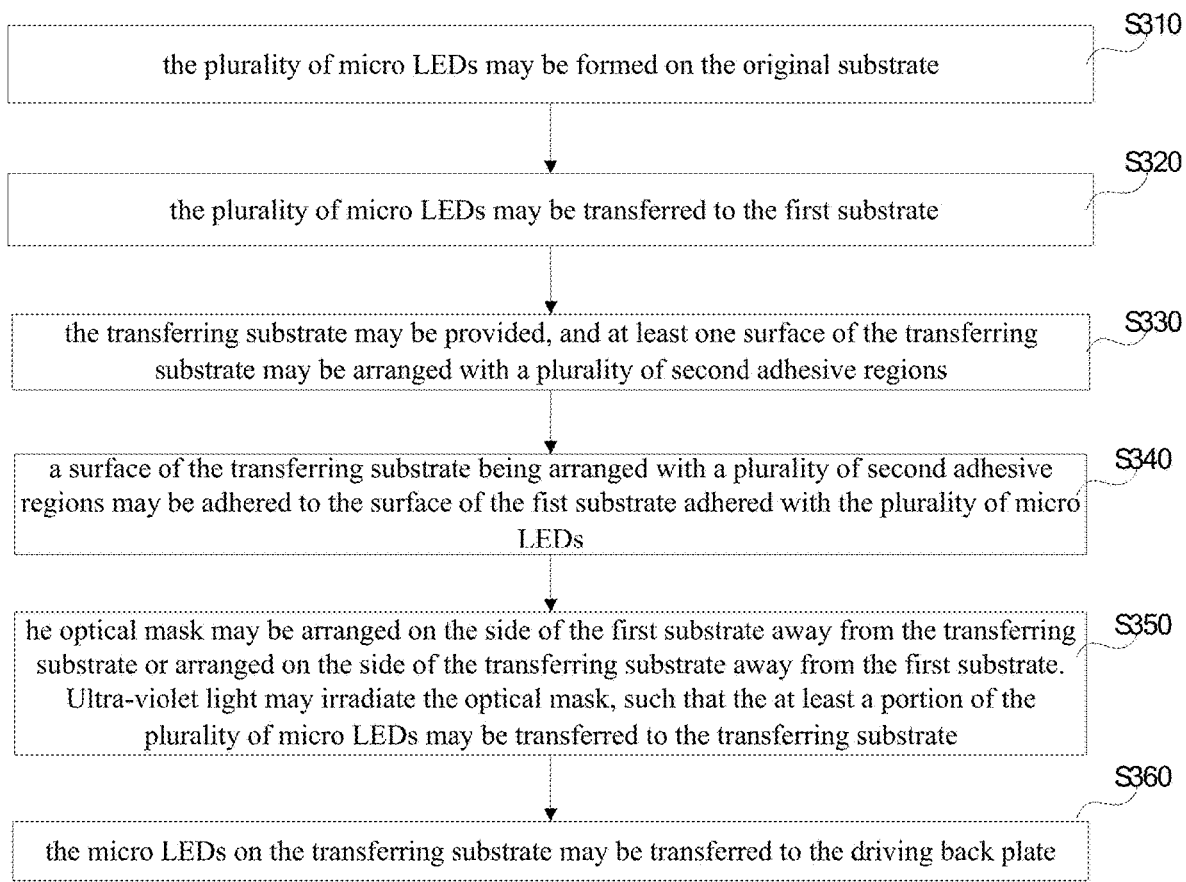
FIG. 14 is a flow chart of a method for transferring a large amount of micro LEDs according to a third embodiment of the present disclosure.

Further referring to FIG. 14, a flow chart of a method for transferring a large amount of micro LEDs according to a third embodiment of the present disclosure is provided. The method for transferring the micro LEDs in the present embodiment may be substantially the same as the method shown in the first embodiment. However, an optical mask may be arranged on a side of the first substrate away from the transferring substrate or on a side of the transferring substrate away from the first substrate. By providing ultra-violet radiation, the adhesiveness of the adhesive layer may be selectively increased or decreased, such that the large amount of micro LEDs may be selectively transferred. The operations in the present embodiment being the same as those shown in the first embodiment will not be repeatedly described hereinafter. The method for transferring the micro LEDs in the present embodiment may include following operations.

In an operation of S310, the plurality of micro LEDs may be formed on the original substrate.

In an operation of S320, the plurality of micro LEDs may be transferred to the first substrate.

In the present embodiment, the first substrate 100 may be made of a transparent material, such as glass, and the like, which will not be limited by the present embodiment.

Operations of S310-S320 may not be necessities of the present disclosure, any one of skill in the art may modify or omit the operations according to actual demands.

In an operation of S330, the transferring substrate may be provided, and at least one surface of the transferring substrate may be arranged with a plurality of second adhesive regions.

Figure 15A:
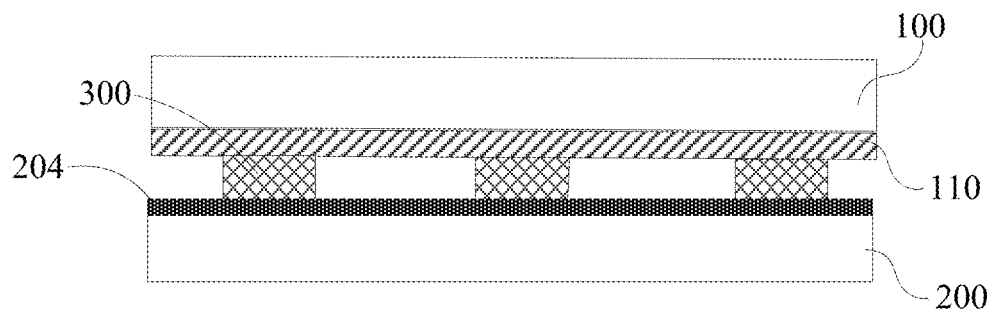
FIG. 15A is a first schematic view of transferring micro LEDs according to the third embodiment of the present disclosure.
Figure 15B:
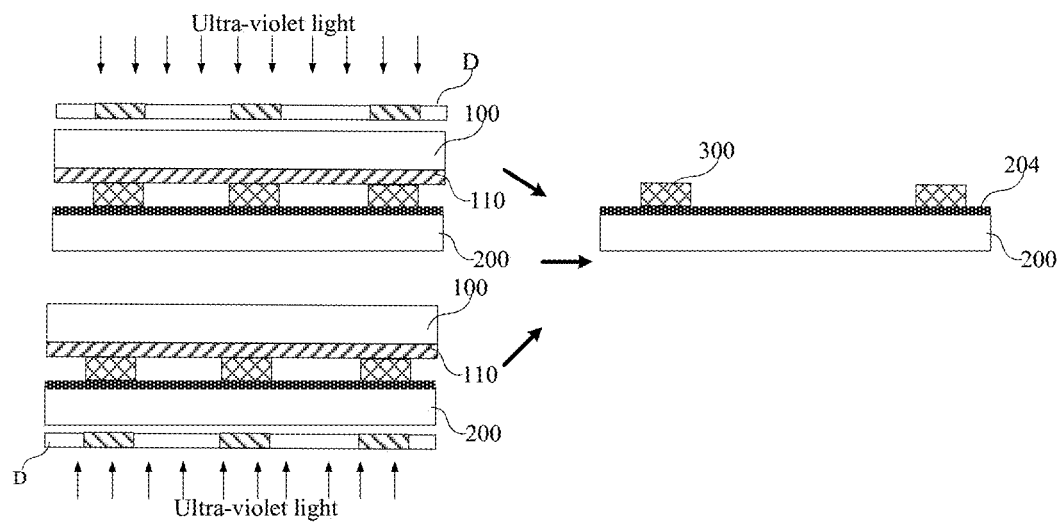
FIG. 15B is a second schematic view of transferring micro LEDs according to the third embodiment of the present disclosure.
Figure 15C:
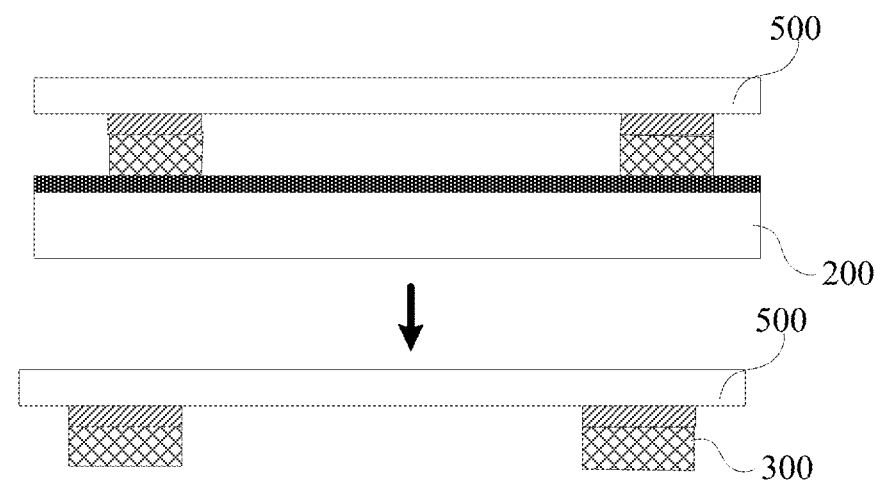
FIG. 15C is a third schematic view of transferring micro LEDs according to the third embodiment of the present disclosure.

Referring to FIGS. 15A-15C, in the present embodiment, the second adhesive regions on the transferring substrate 200 for transferring the micro LEDs 300 adhered on the first substrate 100 may be directly formed by the third adhesive layer 204 coated on the transferring substrate 200. A material of the third adhesive layer 204 may be at least one of adhesive resin, epoxy resin, phenol-formaldehyde resin, urea formaldehyde resin, polyurethane, polyvinyl acetal, and chlorinated polyvinyl chloride resin, which will not be limited by the present disclosure. In one embodiment, the third adhesive layer 204 may be coated by one or more means of blade coating, spraying, spin-coating, and printing, which will not be limited by the present disclosure.

In an operation of S340, a surface of the transferring substrate being arranged with a plurality of second adhesive regions may be adhered to the surface of the first substrate adhered with the plurality of micro LEDs.

In the present embodiment, the second adhesive regions on the transferring substrate 200 may be driven by the transmission assembly to adhere to the plurality of micro LEDs 300 on the first substrate 100.

In an operation of S350, the optical mask may be arranged on the side of the first substrate away from the transferring substrate or arranged on the side of the transferring substrate away from the first substrate. Ultra-violet light may irradiate the optical mask, such that the at least a portion of the plurality of micro LEDs may be transferred to the transferring substrate.

In the operation of S350, by combining the embodiment shown in FIG. 15B with the first embodiment, the optical mask D may be arranged on a side of the first substrate 100 away from the transferring substrate 200. As shown in FIG. 15B, the ultra-violet light may irradiate the optical mask D perpendicularly, and at least a portion of the ultra-violet light may pass through the first substrate 100 reaching the first adhesive layer 110 on the first substrate 100. Alternatively, the adhesiveness of the first adhesive layer 110 irradiated by the ultra-violet light may be reduced or eliminated, such that the micro LED 300, which are adhered to a position being irradiated by the ultra-violet light, may be separated from the first substrate and remain on the transferring substrate 200. The adhesiveness of a position of the first adhesive layer 110 not irradiated by the ultra-violet light may remain unchanged, and therefore, some of the plurality of micro LEDs 300 may remain on the first substrate 100.

In the second embodiment of the present disclosure, the optical mask D may be arranged on a side of the transferring substrate 200 away from the first substrate 100. It may be understood that, the transferring substrate 200 may be a transparent substrate, such as a glass substrate or the like, which will not be limited by the present disclosure. When the ultra-violet light irradiates the optical mask D perpendicularly, at least a portion of the ultra-violet light may pass through the transferring substrate 200 to reach the third adhesive layer 204 on the transferring substrate 200. Alternatively, an adhesiveness of the third adhesive layer irradiated by the ultra-violet light may be increased rapidly, micro LEDs 300 adhered on the regions of the third adhesive layer 204 having rapidly increased adhesiveness may remain on the transferring substrate 200, and an adhesiveness of another region of the third adhesive layer 204 that is not irradiated by the ultra-violet light may remain unchanged, and therefore, micro LEDs 300 contact the another region may remain on the first substrate 100.

In an operation of S360, the micro LEDs on the transferring substrate may be transferred to the driving back plate.

Alternatively, referring to FIG. 15C, the operation of S360 may include bonding the at least a portion of the plurality of micro LEDs 300 adhered on the transferring substrate with the driving electrodes in the subpixel regions of the driving back plate 500 correspondingly, and treating the transferring substrate 200, such that the at least a portion of the plurality of micro LEDs 300 may be separated from the transferring substrate.

Operations of the method for transferring the micro LEDs in the present embodiment being the same as those described in the first embodiment may refer to the above description, and will not be repeatedly described hereinafter.

According to the above embodiment, the optical mask may be arranged on the side of the first substrate away from the transferring substrate or arranged on the side of the transferring substrate away from the first substrate, the adhesiveness of adhesive layers on the first substrate or on the transferring substrate may be selectively changed via ultra-violet light irradiation, such that the large amount of micro LEDs may be selectively transferred.

In summary, any one of skill in the art may understand that, the method for transferring the large amount of micro LEDs and the transferring device may be provided. The plurality of second adhesive regions may be arranged on at least one surface of the transferring substrate. In such a way, the large amount of micro LEDs adhered on the first substrate may be selectively transferred, such that the accuracy and the yield of transferring the micro LEDs may be improved.

The above description only shows some embodiments of the present disclosure, but does not limit the scope of the present disclosure. Any equivalent structural or process transformation performed based on the drawings and the specification of the present disclosure, directly or indirectly applied in any other related arts, should be within the scope of the present disclosure.

What is claimed is:

1. A device for transferring a micro light emitting diode, comprising:
   a first substrate;
   a plurality of first adhesive regions, disposed on at least one surface of the first substrate and defined to adhere a plurality of micro light emitting diodes;
   a transferring substrate, wherein at least one surface of the transferring substrate includes a plurality of protrusions, the transferring substrate configured to transfer at least a portion of the plurality of micro light emitting diodes to a driving back plate;
   a first pressing plate, wherein at least one surface of the first pressing plate defines a plurality of recesses corresponding to the plurality of protrusions on the transferring substrate; and
   a plurality of second adhesive regions, disposed on at least one surface of the transferring substrate and defined to adhere at least a portion of the plurality of micro light emitting diodes.

2. The device according to claim 1, wherein adhesiveness of the plurality of first adhesive regions is less than that of the plurality of second adhesive regions.

3. The device according to claim 2, wherein the at least one surface of the first substrate is arranged with a first adhesive layer; and a surface of the first adhesive layer away from the first substrate has a property of viscosity to define the first adhesive regions.

4. The device according to claim 2, wherein the at least one surface of the transferring substrate is arranged with a plurality of adhesive bumps; and a surface of each of the plurality of adhesive bumps away from the transferring substrate has a property of viscosity to define said second adhesive regions.

5. The device according to claim 4, wherein the plurality of adhesive bumps comprises an adhesive material.

6. The device according to claim 4, wherein the at least one surface of the transferring substrate is arranged with a second adhesive layer, the plurality of protrusions protrude from the at least one surface of the transferring substrate and are covered by the second adhesive layer to serve as the adhesive bumps, and a surface of the second adhesive layer away from the transferring substrate is configured as the second adhesive regions.

7. The device according to claim 6, wherein
   the plurality of protrusions are received into the plurality of recesses to press the second adhesive layer onto surfaces of the plurality of protrusions.

8. The device according to claim 2, wherein at least one surface of the transferring substrate is arranged with a third adhesive layer and a surface of the third adhesive layer away from the transferring substrate has a property of viscosity to define the second adhesive regions.

9. The device according to claim 1, wherein the plurality of second adhesive regions are arranged on the transferring substrate in a first array and the plurality of micro light emitting diodes are arranged on the first substrate in a second array;
   in a row direction, a distance between two adjacent second adhesive regions on the transferring substrate is multiple integer times of a distance between two adjacent micro light emitting diodes on the first substrate; and
   in a column direction, a distance between two adjacent second adhesive regions on the transferring substrate is multiple integer times of a distance between two adjacent micro light emitting diodes on the first substrate.

10. The device according to claim 1, further comprising a transmission mechanism, wherein the transmission mechanism is arranged on a side of the transferring substrate away from the plurality of second adhesive regions and configured to move the transferring substrate.

11. The device according to claim 1, further comprising
a peeling apparatus configured to peel at least part of the plurality of micro light emitting diodes off from the transferring substrate.

12. A device for transferring micro light emitting diodes, comprising:
- a first substrate, defining a first adhesive region, wherein a plurality of micro light emitting diodes are capable of being adhered to the first adhesive region;
- a transferring substrate, arranged with a plurality of adhesive bumps protruding from a surface of the transferring substrate, wherein a surface of each adhesive bump away from the transferring substrate has the property of viscosity and is capable of being adhered to at least part of the plurality of micro light emitting diodes, and adhesiveness of the surface of each adhesive bump is greater than adhesiveness of the first adhesive region;
- a first pressing plate, wherein at least one surface of the first pressing plate defines a plurality of recesses corresponding to the plurality of adhesive bumps on the transferring substrate.

13. The device according to claim 12, wherein the plurality of adhesive bumps are arranged in a first array and the plurality of micro light emitting diodes are arranged on the first substrate in a second array;
- in a row direction, a distance between two adjacent adhesive bumps is multiple integer times of a distance between two adjacent micro light emitting diodes; and
- in a column direction, a distance between two adjacent adhesive bumps is multiple integer times of a distance between two adjacent micro light emitting diodes.

\* \* \* \* \*